United States Patent
Sato et al.

(10) Patent No.: US 8,624,240 B2
(45) Date of Patent: Jan. 7, 2014

(54) TOP GATE THIN FILM TRANSISTOR AND DISPLAY APPARATUS INCLUDING THE SAME

(75) Inventors: Ayumu Sato, Kawasaki (JP); Hideya Kumomi, Tokyo (JP); Hisato Yabuta, Machida (JP); Ryo Hayashi, Yokohama (JP); Yasuyoshi Takai, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 134 days.

(21) Appl. No.: 13/188,215

(22) Filed: Jul. 21, 2011

(65) Prior Publication Data
US 2012/0032173 A1  Feb. 9, 2012

(30) Foreign Application Priority Data

Aug. 3, 2010  (JP) ................................. 2010-174234

(51) Int. Cl.
*H01L 29/786* (2006.01)

(52) U.S. Cl.
USPC ..................................... 257/43; 257/E29.273

(58) Field of Classification Search
USPC ............................................ 257/43, E29.273
See application file for complete search history.

(56) References Cited

U.S. PATENT DOCUMENTS

| | | | |
|---|---|---|---|
| 6,331,474 B1 | 12/2001 | Hayashi et al. | |
| 6,452,091 B1 | 9/2002 | Nakagawa et al. | |
| 6,716,324 B2 | 4/2004 | Yamashita et al. | |
| 6,794,275 B2 | 9/2004 | Kondo et al. | |
| 6,855,621 B2 | 2/2005 | Kondo et al. | |
| 6,858,308 B2 | 2/2005 | Kondo et al. | |
| 6,930,025 B2 | 8/2005 | Nakayama et al. | |
| 7,282,132 B2 | 10/2007 | Iwata et al. | |
| 8,044,402 B2 | 10/2011 | Yabuta et al. | |
| 8,183,099 B2 * | 5/2012 | Sakata | 438/149 |
| 8,236,627 B2 * | 8/2012 | Tsubuku et al. | 438/149 |
| 2007/0090365 A1 | 4/2007 | Hayashi et al. | |
| 2009/0001881 A1 | 1/2009 | Nakayama | |
| 2009/0267173 A1 | 10/2009 | Takahashi | |
| 2009/0325341 A1 | 12/2009 | Itagaki et al. | |
| 2010/0051936 A1 | 3/2010 | Hayashi et al. | |
| 2010/0051938 A1 | 3/2010 | Hayashi et al. | |

(Continued)

FOREIGN PATENT DOCUMENTS

| | | |
|---|---|---|
| JP | 2007-220817 | 8/2007 |
| JP | 2010-45263 | 2/2010 |
| JP | 2012033836 A * | 2/2012 |

OTHER PUBLICATIONS

"4 inch QVGA AMOLED Driven by the Threshold Voltage Controlled Amorphous GIZO (Ga2-O3-In2O3-AnO) TFT", Kyong-Seok Son, et al., Society for Information Display, 2008 International Symposium, Digest of Technical Papers, vol. XXXIX, Book II, p. 633-636 (May 2008).

*Primary Examiner* — George Fourson, III
(74) *Attorney, Agent, or Firm* — Fitzpatrick, Cella, Harper and Scinto

(57) ABSTRACT

Provided is a top gate thin film transistor, including on a substrate: a source electrode layer; a drain electrode layer; an oxide semiconductor layer; a gate insulating layer; a gate electrode layer including an amorphous oxide semiconductor containing at least one kind of element selected from among In, Ga, Zn, and Sn; and a protective layer containing hydrogen, in which: the gate insulating layer is formed on a channel region of the oxide semiconductor layer; the gate electrode layer is formed on the gate insulating layer; and the protective layer is formed on the gate electrode layer.

5 Claims, 5 Drawing Sheets

(56) References Cited

U.S. PATENT DOCUMENTS

| | | |
|---|---|---|
| 2010/0065837 A1 | 3/2010 | Omura et al. |
| 2010/0233848 A1* | 9/2010 | Ohara et al. .................. 438/104 |
| 2010/0283049 A1* | 11/2010 | Sato et al. ....................... 257/43 |
| 2010/0283094 A1 | 11/2010 | Kim et al. |
| 2011/0073856 A1* | 3/2011 | Sato et al. ....................... 257/43 |
| 2011/0133179 A1* | 6/2011 | Yamazaki ....................... 257/43 |
| 2012/0032173 A1* | 2/2012 | Sato et al. ....................... 257/59 |
| 2012/0223308 A1* | 9/2012 | Okabe et al. .................... 257/43 |

* cited by examiner

TOP GATE THIN FILM TRANSISTOR AND DISPLAY APPARATUS INCLUDING THE SAME

BACKGROUND OF THE INVENTION

1. Field of the Invention

The present invention relates to a top gate thin film transistor (top gate type thin film transistor) that uses an oxide semiconductor for a semiconductor layer, and a display apparatus including the top gate thin film transistor.

2. Description of the Related Art

Thin film transistors (TFTs) that use amorphous silicon or low-temperature polysilicon for a semiconductor layer are widely used in a drive circuit in display apparatuses such as active matrix liquid crystal display devices and organic electroluminescence (EL) display devices. However, the manufacture of those TFTs requires a high temperature process, and hence it is difficult to employ a flexible substrate such as a plastic substrate or a film substrate which is low in heat resistance.

Meanwhile, in recent years, the development of TFTs that use, for a semiconductor layer, an oxide semiconductor having ZnO as a main component has recently become active. This oxide semiconductor can be made into a film at low temperature, and hence it is possible to form a TFT on a plastic substrate, a film substrate, or the like. However, the oxide semiconductor having ZnO as the main component has high sensitivity with respect to an atmosphere, and hence, in order to enable actual use of the TFT, it is necessary to isolate the oxide semiconductor layer from the atmosphere by a protective layer.

A plasma-enhanced chemical vapor deposition (PECVD) method is generally used as a method of forming the protective layer, which is high in film formation speed and is excellent in productivity. However, it is known that an insulating layer made of silicon nitride or the like, which is formed by a PECVD method and serves as a protective layer, has a large hydrogen amount in the layer, and hence when hydrogen is diffused from the protective layer into a channel region formed in the oxide semiconductor, the resistance of the oxide semiconductor is reduced (see SID'08 Digest, p. 633 (2008)).

As a method of preventing hydrogen from diffusing into the channel region, there is disclosed a method of forming a protective layer containing hydrogen while using a gate insulating layer and a gate electrode layer as a mask in a top gate polycrystalline oxide TFT having ZnO as the main component (see Japanese Patent Application Laid-Open No. 2007-220817). In this case, the hydrogen concentration of the semiconductor layer in an unmasked region increases, and therefore the resistance of the unmasked region of the semiconductor layer reduces. In this manner, source and drain electrode layers are formed in a self-alignment manner, and thus a TFT having a coplanar structure may be obtained.

In the structure disclosed in Japanese Patent Application Laid-Open No. 2007-220817, in order to prevent hydrogen from diffusing into the channel region of the semiconductor layer when the protective layer containing hydrogen is formed, the gate insulating layer or the gate electrode layer to be the mask is required to have a function of sufficiently suppressing the hydrogen diffusion.

When silicon oxide or the like is used for the gate insulating layer, in order to suppress reduction in resistance of the semiconductor layer, the gate insulating layer is preferred to be formed thick. However, the increase in thickness of the gate insulating layer may cause an increase in drive voltage of the TFT, or lowering of an on-current or deterioration of an S value.

Therefore, it is more desired to provide a function of suppressing hydrogen diffusion to the gate electrode layer. However, the inventors of the prevent invention have been made clear that, when Mo is used for the gate electrode layer, hydrogen diffusion cannot be suppressed even if the film thickness is 200 nm. Further, even when a polycrystalline oxide semiconductor such as indium tin oxide (ITO) and ZnO is used for the gate electrode layer, hydrogen is diffused through grain boundaries in the polycrystalline oxide semiconductor, and hence the reduction in resistance of the channel region of the semiconductor layer cannot be suppressed. From the facts above, a gate electrode layer capable of suppressing hydrogen diffusion has been desired.

SUMMARY OF THE INVENTION

It is therefore an object of the present invention to provide a top gate oxide semiconductor TFT, which is capable of suppressing reduction in resistance of a channel region of an oxide semiconductor layer due to hydrogen diffusion, and to provide a display apparatus including the top gate oxide semiconductor TFT.

In order to solve the above-mentioned problems, according to the present invention, there is provided a top gate thin film transistor including on a substrate: a source electrode layer; a drain electrode layer; an oxide semiconductor layer; a gate insulating layer; a gate electrode layer including an amorphous oxide semiconductor containing at least one kind of element selected from among In, Ga, Zn, and Sn; and a protective layer containing hydrogen, in which: the gate insulating layer is formed on a channel region of the oxide semiconductor layer; the gate electrode layer is formed on the gate insulating layer; and the protective layer is formed on the gate electrode layer.

According to the present invention, even in a case where deposition of the protective layer containing hydrogen or hydrogen plasma processing is carried out, it is possible to suppress the reduction in resistance of the channel region made of an oxide semiconductor. Further, by employing the gate electrode layer of the present invention, a leakage current density of the gate insulating layer may be reduced.

Further features of the present invention will become apparent from the following description of exemplary embodiments with reference to the attached drawings.

DESCRIPTION OF THE EMBODIMENT

Hereinafter, a top gate thin film transistor (top gate type thin film transistor) (TFT) according to an exemplary embodiment of the present invention is described with reference to the accompanying drawings.

Figure 1:
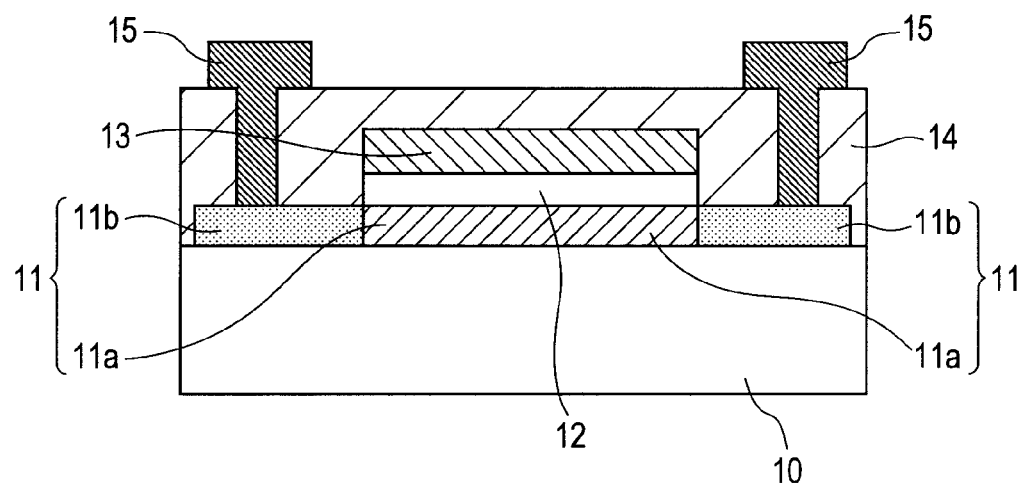
FIG. 1 is a schematic cross-sectional view of an oxide semiconductor TFT having a top gate coplanar structure.

FIG. 1 is a cross-sectional view illustrating a structure of an oxide semiconductor TFT having a top gate coplanar structure, which is an example of the exemplary embodiment of the present invention. The oxide semiconductor TFT includes a substrate 10, an oxide semiconductor layer 11 including a channel region 11a and source and drain regions 11b, a gate insulating layer 12, a gate electrode layer 13, a protective layer 14, and source and drain wiring layers 15.

A glass substrate is preferred to be used as the substrate 10. Alternatively, there may be employed a plastic film of polyethylene terephthalate (PET), polyethylene naphthalate (PEN), polyimide, polycarbonate, and the like, a thin plate, a stainless substrate coated with an insulating layer, and the like.

First, on the substrate 10, the oxide semiconductor layer 11 is formed by methods such as a sputtering method, a pulse laser deposition (PLD) method, and an electron beam deposition method. After that, the oxide semiconductor layer 11 is patterned by a photolithography method and an etching method. As the oxide semiconductor layer 11, an amorphous oxide semiconductor containing at least one kind of element selected from among In, Ga, Zn, and Sn is preferred to be used.

Next, on the oxide semiconductor layer 11 (on the channel region 11a of the oxide semiconductor layer), the gate insulating layer 12 is formed by methods such as a sputtering method, a pulse laser deposition (PLD) method, an electron beam deposition method, and a plasma-enhanced CVD method. The gate insulating layer 12 is provided in direct contact to the oxide semiconductor layer 11, and hence the gate insulating layer 12 is required to have a function of suppressing reduction in resistance of the channel region 11a of the oxide semiconductor layer when the gate insulating layer 12 is formed. Specifically, as the gate insulating layer 12, an insulating layer containing oxygen, such as a silicon oxide layer and a silicon oxynitride layer, is preferred to be used. Those insulating layers raise no problems even when the compositions of the insulating layers do not strictly follow stoichiometry. For example, an amorphous structure may be employed.

Subsequently, on the gate insulating layer 12, the gate electrode layer 13 is formed by methods such as a sputtering method, a PLD method, and an electron beam deposition method. After that, the gate insulating layer and the gate electrode layer 13 are patterned by a photolithography method and an etching method. As the gate electrode layer 13, an amorphous oxide semiconductor layer containing at least one kind of element selected from among In, Ga, Zn, and Sn is preferred to be used. The gate electrode layer 13 may be formed of a laminate of a metal electrode material made of a metal such as Ti, Pt, Au, Ni, Al, and Mo and alloys of those metal elements, or a laminate film of the metal electrode materials, and an electrode material such as an oxide conductor including ITO. In this case, any one of the electrode materials may be the upper layer.

Next, on the oxide semiconductor layer 11 (on regions which become the source and drain regions 11b of the oxide semiconductor layer) and on the gate electrode layer 13, the protective layer 14 is formed. The protective layer 14 is required to have a function of reducing resistance of regions of the oxide semiconductor layer 11 in which the gate electrode layer 13 is not formed on its upper side (the regions which become the source and drain regions 11b of the oxide semiconductor layer), and the gate electrode layer 13 made of an oxide semiconductor. The resistance of the oxide semiconductor may be reduced by adding hydrogen, and hence as the protective layer 14, an insulating layer containing hydrogen is preferred to be used. Specifically, it is preferred to use a silicon nitride film, a silicon oxide film, a silicon oxynitride film, or a silicon carbide film containing hydrogen, or a laminate thereof. Those insulating layers raise no problems even when the compositions of the insulating layers do not follow stoichiometry. A plasma-enhanced CVD method that uses a raw material gas containing hydrogen is desired as a method of forming the protective layer 14, in light of the plasma's effect of accelerating hydrogen diffusion into an oxide semiconductor. At this time, hydrogen in the raw material diffuses into the regions of the oxide semiconductor layer 11 in which the gate electrode layer 13 is not formed on its upper side (the regions which become the source and drain regions 11b of the oxide semiconductor layer) and into the gate electrode layer 13. With this diffusion, the resistance of the regions of the oxide semiconductor layer 11 in which the gate electrode layer 13 is not formed on its upper side is reduced, and at the same time, the resistance of the gate electrode layer 13 is reduced. Further, at this time, in the regions of the oxide semiconductor layer 11 in which the gate electrode layer 13 is not formed on its upper side, with the use of the gate insulating layer 12 and the gate electrode layer 13 as a mask, the source and drain regions 11b of the oxide semiconductor layer are formed in a self-alignment manner. That is, a source electrode layer and a drain electrode layer are formed. In this case, the channel region 11a of the oxide semiconductor layer and the source and drain regions 11b of the oxide semiconductor layer are formed of the same oxide semiconductor layer 11. Accordingly, a TFT that has small parasitic capacitance can be manufactured. Note that, the source and drain regions 11b of the oxide semiconductor layer may be separately formed by different layers, to thereby form the source and drain electrode layers. The structure of the TFT in this case is preferred to be a bottom contact structure illustrated in FIG. 2, a top contact structure illustrated in FIG. 3, or the like. As the source and drain electrode layers in this case, it is preferred to use a metal electrode material made of a metal such as Ti, Pt, Au, Ni, Al and Mo, and alloys of those metal elements, a laminate film of the metal electrode materials, or an oxide conductor such as ITO.

Subsequently, contact holes are formed in the protective layer 14 by a photolithography method and an etching method. After that, the source and drain wiring layers 15 are formed for electric connection to the outside by methods such as a sputtering method, a pulse laser deposition (PLD) method, an electron beam deposition method, and a CVD method. As the source and drain wiring layers 15, any material that has good electric conductivity can be employed, and it is preferred to use, for example, a metal electrode material made of a metal such as Ti, Pt, Au, Ni, Al and Mo, and an alloy of those metal elements, a laminate film of the metal electrode materials, or an oxide conductor such as ITO. Note that, the source and drain regions 11b of the oxide semiconductor layer can be used as the source and drain wiring layers 15 as it is.

Figure 4:
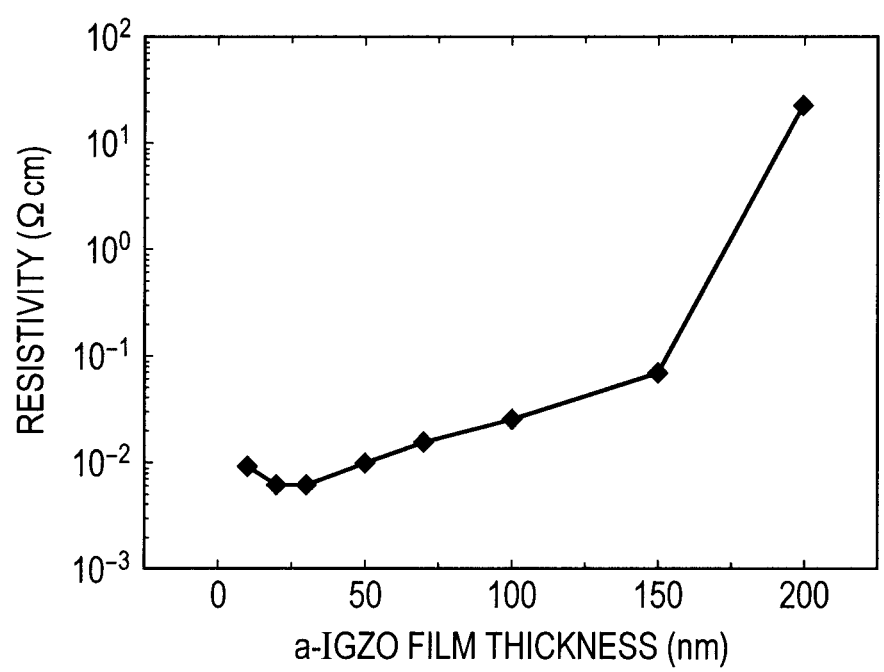
FIG. 4 is a graph illustrating a film thickness dependency of a resistivity of an amorphous IGZO layer.

Here, FIG. 4 illustrates the film thickness dependence of the resistivity obtained when a silicon nitride layer, which is the insulating layer containing hydrogen, is formed on the gate electrode layer made of an In—Ga—Zn—O-based amorphous oxide semiconductor (amorphous IGZO). The silicon nitride layer is formed by a PECVD method. Before the silicon nitride layer is formed, the amorphous oxide semiconductor has a resistivity of a value larger than $10^5$ Ωcm, which is a measurement limit, but by forming the silicon nitride layer, the resistance is sufficiently reduced as illustrated in FIG. 4. From FIG. 4, it is understood that when the film thickness of the gate electrode layer made of an amorphous oxide semiconductor exceeds 30 nm, the resistivity thereof increases. This shows that there is a resistivity distribution in a film thickness direction, and hence it may be said that as a portion in the amorphous oxide semiconductor film is spaced apart from the interface with the insulating layer containing hydrogen, the resistivity thereof increases. That is, the amorphous oxide semiconductor has a function of suppressing the reduction in resistance due to hydrogen diffusion.

Figure 5:
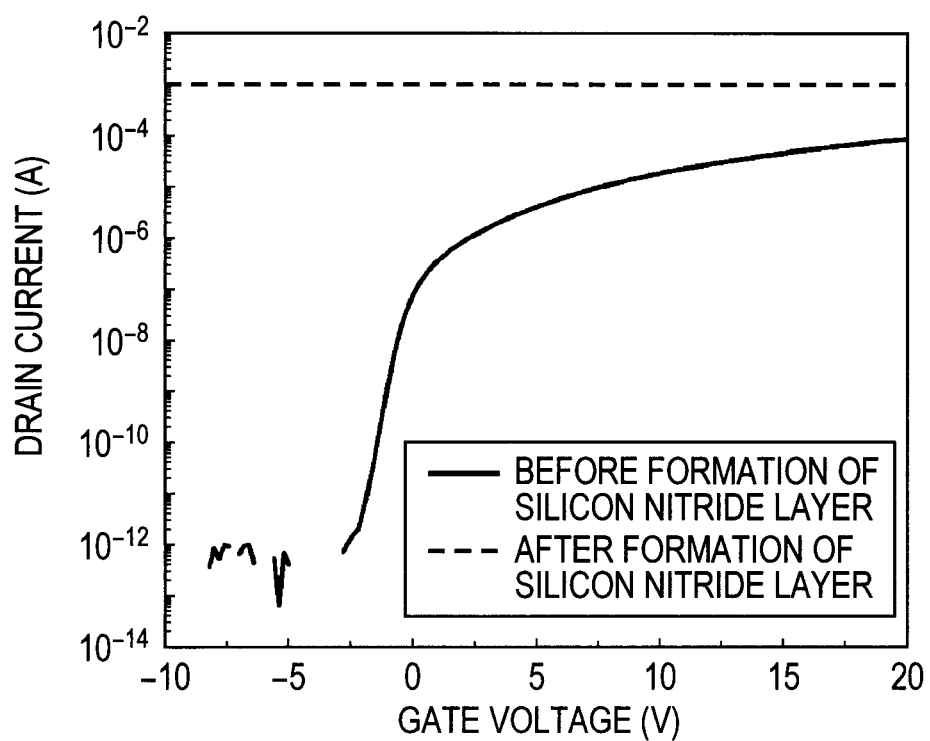
FIG. 5 is a graph illustrating Id-Vg characteristics of the oxide semiconductor TFT.

Meanwhile, a bottom gate oxide semiconductor TFT is manufactured, in which a laminate film including a silicon oxide layer and an Mo layer being sequentially formed is formed on the amorphous oxide semiconductor. At this time, the silicon oxide layer and the Mo layer have a film thickness of 300 nm and 200 nm, respectively. The silicon oxide layer and the Mo layer are formed by a PECVD method and a sputtering method, respectively. FIG. 5 illustrates Id-Vg characteristics of cases before and after the silicon nitride layer, which is the insulating layer containing hydrogen, is formed on this TFT. It is understood from FIG. 5 that even if the silicon oxide layer having a film thickness of 300 nm and the Mo layer having the film thickness of 200 nm are present, after the silicon nitride layer is formed, the TFT cannot be turned OFF. That is, it is understood that those films cannot suppress reduction in resistance of the channel region of the oxide semiconductor layer due to the hydrogen diffusion from the silicon nitride layer. This reason is not clear, but because the Mo layer is a polycrystalline film, there is a possibility that an enhanced diffusion in grain boundaries causes this result. On the other hand, there are no grain boundaries in an amorphous oxide semiconductor. From those results and because the gate insulating layer is desired to be thin in view of the TFT characteristics, it can be said that the gate electrode layer 13 is desired to have a function of suppressing hydrogen diffusion.

Figure 6:
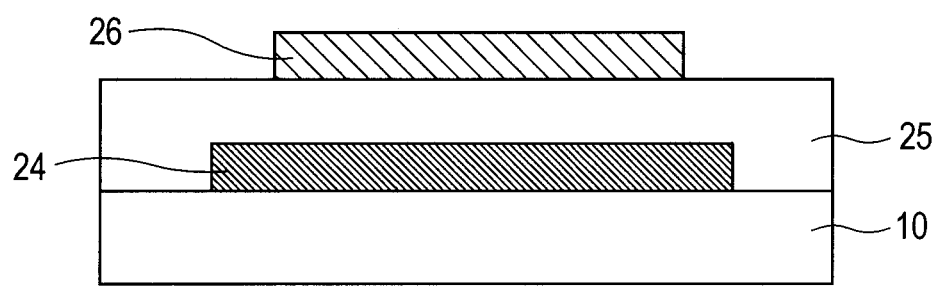
FIG. 6 is a schematic cross-sectional view of a storage capacitor formed by sandwiching an insulating layer between two electrode layers.
Figure 7:
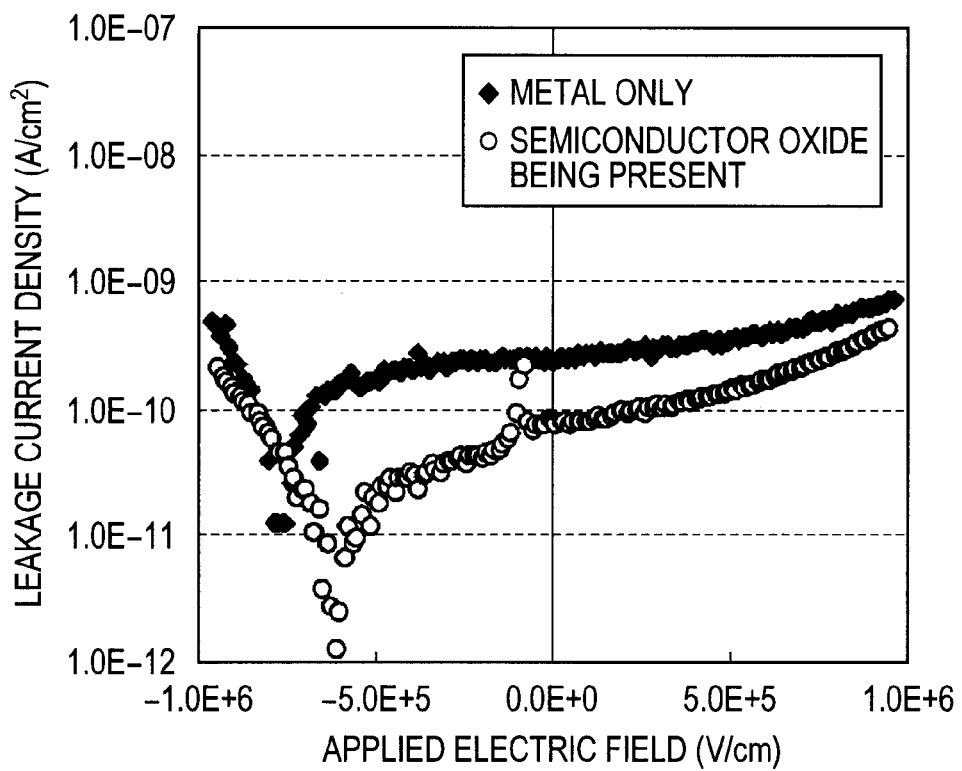
FIG. 7 is a graph comparing leakage characteristics of the insulating layer in relation to presence and absence of an oxide semiconductor layer.

Further, in a structure illustrated in FIG. 6, on the substrate 10, a storage capacitor including a lower electrode layer 24, an insulating layer 25, and an upper electrode layer 26 is formed. FIG. 7 illustrates a comparison of a leakage current density between the lower electrode layer 24 and the upper electrode layer 26, between a case where an amorphous oxide semiconductor subjected to resistance reduction is used as the upper electrode layer 26 and a case where a metal is used as the upper electrode layer 26. In this case, a Ti/Au/Ti layer and a silicon oxide layer are used as the lower electrode layer 24 and the insulating layer 25, respectively. As illustrated in FIG. 6, it is understood that when an amorphous oxide semiconductor layer is used on a side of the upper electrode layer 26 of the storage capacitor provided in contact to the insulating layer, the leakage current density between the lower electrode layer 24 and the upper electrode layer 26 is smaller. From the description above, an effect may be expected that, even when an amorphous oxide semiconductor layer subjected to resistance reduction as described above is used as the gate electrode layer in the top gate TFT, the leakage current density of the gate insulating layer is reduced.

The oxide semiconductor TFT having the top gate coplanar structure is thus completed. In the present invention, multiple transistors structured as above can be arranged two-dimensionally on the substrate (arranged in crosswise and lengthwise directions as if forming a plane).

EXAMPLES

Hereinafter, examples of the present invention are described in detail, but the present invention is in no way limited by the examples.

Example 1

FIG. 1 illustrates an oxide semiconductor TFT having a top gate coplanar structure according to this example.

First, on the glass substrate 10, an amorphous IGZO film having a film thickness of 30 nm was formed as the oxide semiconductor layer 11 by a sputtering method. In order to form the oxide semiconductor layer 11, a DC sputtering apparatus was used and the substrate temperature was set to room temperature (25° C.). A target of a polycrystalline sintered body having an $InGaZnO_4$ composition was used with the input DC power set to 300 W. During the film formation, the atmosphere was set to a total pressure of 0.5 Pa and the gas flow rate at that time was set to $Ar:O_2=98:2$. After that, the oxide semiconductor layer 11 was patterned by a photolithography method and an etching method.

Next, on the oxide semiconductor layer 11 (on the channel region 11a of the oxide semiconductor layer), a silicon oxide film having a thickness of 100 nm was formed as the gate insulating layer 12 by a sputtering method. The silicon oxide film was formed at room temperature using an RF sputtering apparatus. A 4-inch diameter $SiO_2$ target was used with the input RF power set to 500 W. During the film formation, the atmosphere was set to a total pressure of 0.5 Pa and the gas flow rate at that time was set to $Ar:O_2=90:10$.

Subsequently, on the gate insulating layer 12, an amorphous IGZO film having a film thickness of 200 nm was formed as the gate electrode layer 13 by a sputtering method. In order to form the gate electrode layer 13, the DC sputtering apparatus was used and the substrate temperature was set to room temperature (25° C.). A target of a polycrystalline sintered body having an $InGaZnO_4$ composition was used with the input DC power set to 150 W. During the film formation, the atmosphere was set to a total pressure of 0.5 Pa and the gas flow rate at that time was set to $Ar:O_2=80:20$. After that, the gate insulating layer 12 and the gate electrode layer 13 were patterned by a photolithography method and an etching method.

Next, on the oxide semiconductor layer 11 (on regions which become the source and drain regions 11b of the oxide semiconductor layer) and on the gate electrode layer 13, a silicon nitride film containing hydrogen having a film thickness of 300 nm was formed as the protective layer 14 by a plasma-enhanced CVD method. The substrate temperature was set to 150° C. in this plasma-enhanced CVD method for forming the silicon nitride film. $SiH_4$, $NH_3$, and $N_2$ were used as a process gas. The gas flow rate was set to $SiH_4:NH_3:N_2=1:2.5:25$. The input RF power density and the pressure were set to 0.9 W/cm$^2$ and 150 Pa, respectively. Further, simultaneously with the formation of the protective layer 14, the resistance of the regions of the oxide semiconductor layer 11, in which the gate electrode layer 13 is not formed on its upper side, was reduced, to thereby become the source and drain regions 11b of the oxide semiconductor layer. Further, the resistance of the gate electrode layer 13 was reduced.

Finally, contact holes were formed in the protective layer 14 by a photolithography method and an etching method. Then, an Mo film having a film thickness of 100 nm was formed as the source and drain wiring layers 15. After that, the source and drain wiring layers 15 were patterned by a photolithography method and an etching method.

Through the above-mentioned steps, the oxide semiconductor TFT of this example was completed.

In this example, an amorphous oxide semiconductor having a film thickness of 200 nm was formed as the gate electrode layer 13 of the top gate TFT, and on the gate electrode layer 13, a silicon nitride film containing hydrogen having a film thickness of 300 nm was formed as the protective layer 14. In this manner, as described with reference to FIGS. 4 and 7, it was possible to suppress reduction in resistance of the channel region 11a of the oxide semiconductor layer due to hydrogen diffusion, and was also possible to reduce the leakage current density of the gate insulating layer 12.

Example 2

Figure 2:
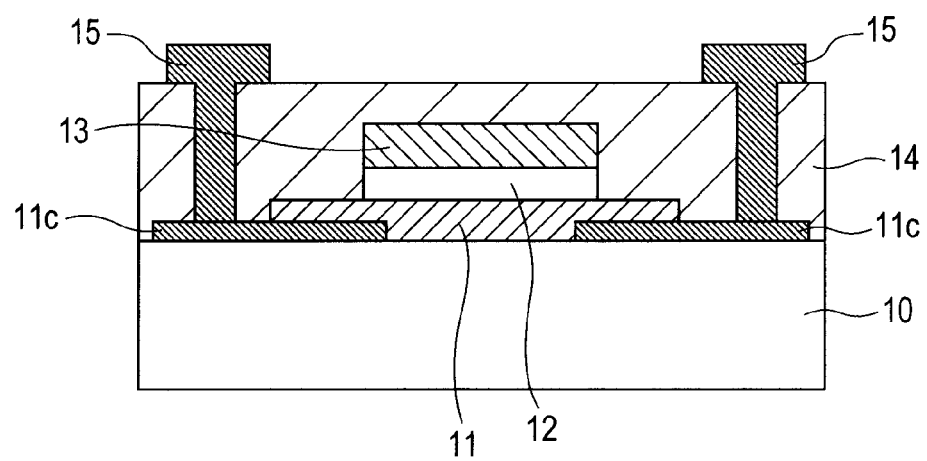
FIG. 2 is a schematic cross-sectional view of an oxide semiconductor TFT having a bottom contact structure.
Figure 3:
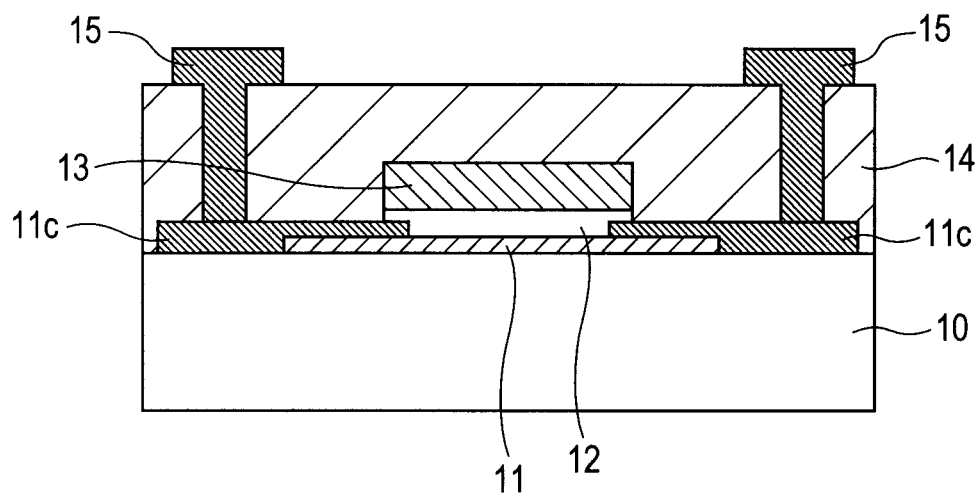
FIG. 3 is a schematic cross-sectional view of an oxide semiconductor TFT having a top contact structure.

FIG. 2 illustrates an oxide semiconductor TFT having a top gate bottom contact structure according to this example.

First, on the glass substrate 10, an Mo film having a film thickness of 200 nm was formed as source and drain electrode layers 11c. After that, the source and drain electrode layers 11c were patterned by a photolithography method and an etching method.

Next, in the same manner as in Example 1, the oxide semiconductor layer 11 (channel region of the oxide semiconductor layer) and the gate insulating layer 12 were sequentially formed.

Subsequently, on the gate insulating layer 12, an amorphous IGZO film having a film thickness of 200 nm was formed as the gate electrode layer 13 by a sputtering method. The gate electrode layer 13 was formed at room temperature (25° C.) using a DC sputtering apparatus. A target of a polycrystalline sintered body having an InGaZnO$_4$ composition was used with the input DC power set to 150 W. During the film formation, the atmosphere was set to a total pressure of 0.5 Pa and the gas flow rate at that time was set to Ar:O$_2$=80:20. After that, the gate electrode layer 13 was patterned by a photolithography method and an etching method.

Next, in the same manner as in Example 1, the protective layer 14 was formed. With the formation of the protective layer 14, the resistance of the gate electrode layer 13 was reduced.

Finally, contact holes were formed in the protective layer 14 by a photolithography method and an etching method. Then, an Mo film having a film thickness of 100 nm was formed as the source and drain wiring layers 15. After that, the source and drain wiring layers 15 were patterned by a photolithography method and an etching method.

Through the above-mentioned steps, the oxide semiconductor TFT of this example was completed.

In this example, an amorphous oxide semiconductor having a film thickness of 200 nm was formed as the gate electrode layer 13 of the top gate TFT, and on the gate electrode layer 13, a silicon nitride film containing hydrogen having a film thickness of 300 nm was formed as the protective layer 14. In this manner, as described with reference to FIGS. 4 and 7, similarly to Example 1, it was possible to suppress reduction in resistance of the oxide semiconductor layer 11 (channel region of the oxide semiconductor layer) due to hydrogen diffusion, and was also possible to reduce the leakage current density of the gate insulating layer 12.

Example 3

Figure 8:
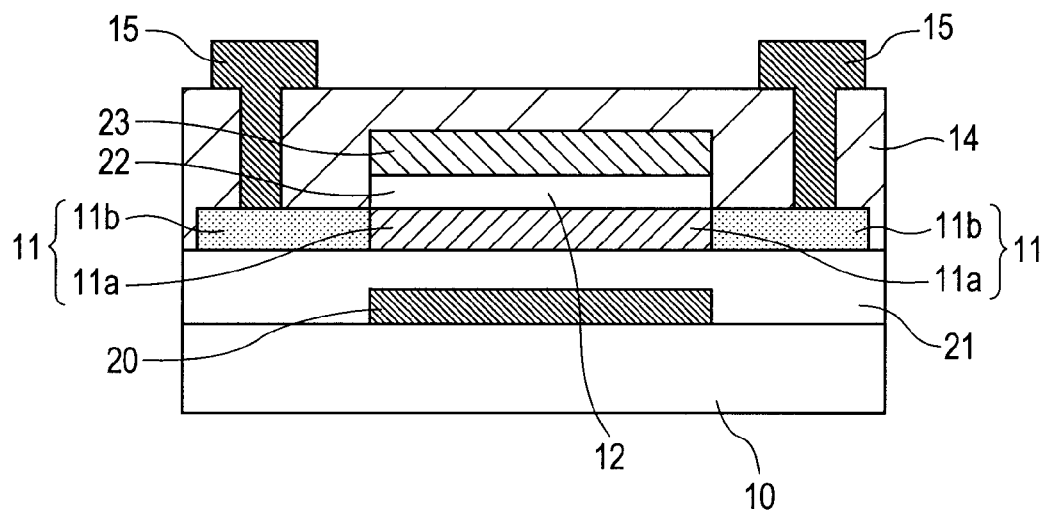
FIG. 8 is a schematic cross-sectional view of an oxide semiconductor TFT having a double gate coplanar structure.

FIG. 8 illustrates an oxide semiconductor TFT having a double gate coplanar structure according to this example.

First, on the glass substrate 10, an Mo film having a film thickness of 200 nm was formed as a bottom gate electrode layer 20. After that, the bottom gate electrode layer 20 was patterned by a photolithography method and an etching method.

Next, on the glass substrate 10 and on the bottom gate electrode layer 20, a silicon oxide film having a film thickness of 200 nm was formed as a lower gate insulating layer 21 by a plasma-enhanced CVD method. The substrate temperature was set to 340° C. in this plasma-enhanced CVD method for forming the silicon oxide film. SiH$_4$ and N$_2$O were used as a process gas. The gas flow rate was set to SiH$_4$:N$_2$O=1:25. The input RF power density and the pressure were set to 0.9 W/cm$^2$ and 173 Pa, respectively.

Next, in the same manner as in Example 1, the oxide semiconductor layer 11 was formed.

Subsequently, on the oxide semiconductor layer 11 (on the channel region 11a of the oxide semiconductor layer), a silicon oxide film having a film thickness of 100 nm was formed as an upper gate insulating layer 22 by a sputtering method. The upper gate insulating layer 22 was formed at room temperature (25° C.) using an RF sputtering apparatus. A target of SiO$_2$ was used with the input RF power set to 500 W. During the film formation, the atmosphere was set to a total pressure of 0.5 Pa and the gas flow rate at that time was set to Ar:O$_2$=90:10.

Next, contact holes (not shown in FIG. 8) were formed in the lower gate insulating layer 21 and the upper gate insulating layer 22 by a photolithography method and an etching method.

Subsequently, on the upper gate insulating layer 22, an amorphous IGZO film having a film thickness of 200 nm was formed as a top gate electrode layer 23 by a sputtering method. In order to form the top gate electrode layer 23, the DC sputtering apparatus was used and the substrate temperature was set to room temperature (25° C.). A target of a polycrystalline sintered body having an InGaZnO$_4$ composition was used with the input DC power set to 150 W. During the film formation, the atmosphere was set to a total pressure of 0.5 Pa and the gas flow rate at that time was set to Ar:O$_2$=80:20. The bottom gate electrode layer 20 and the top gate electrode layer 23 are electrically connected to each other via the above-mentioned contact holes. After that, the upper gate insulating layer 22 and the top gate electrode layer 23 were patterned by a photolithography method and an etching method, by employing backside exposure which uses the bottom gate electrode layer 20 as a mask. By employing backside exposure which uses the bottom gate electrode layer 20 as a mask, the top gate electrode layer 23 was patterned in an almost self-alignment manner with respect to the bottom gate electrode layer 20.

Next, in the same manner as in Example 1, the protective layer 14 was formed. Simultaneously with the formation of the protective layer 14, the resistance of the regions of the oxide semiconductor layer 11, in which the top gate electrode layer 23 is not formed on the upper side, was reduced, to thereby become the source and drain regions 11b of the oxide semiconductor layer. In addition, the resistance of the top gate electrode layer 23 was reduced. The source and drain regions 11b of the oxide semiconductor layer were formed in an almost self-alignment manner with respect to the bottom gate electrode layer 20, and in a self-alignment manner with respect to the top gate electrode layer 23.

Finally, contact holes were formed in the protective layer 14 by a photolithography method and an etching method. Then, an Mo film having a film thickness of 100 nm was formed as the source and drain wiring layers 15. After that, the source and drain wiring layers 15 were patterned by a photolithography method and an etching method.

Through the above-mentioned steps, the oxide semiconductor TFT of this example was completed.

In this example, an amorphous oxide semiconductor having a film thickness of 200 nm was formed as the upper gate electrode layer 23 of the double gate TFT, and on the upper gate electrode layer 23, a silicon nitride film containing hydrogen having a film thickness of 300 nm was formed as the protective layer 14. In this manner, as described with reference to FIGS. 4 and 7, similarly to Examples 1 and 2, it was possible to suppress reduction in resistance of the channel region 11a of the oxide semiconductor layer due to hydrogen diffusion, and was also possible to reduce the leakage current density of the gate insulating layer 12.

Example 4

Figure 9:
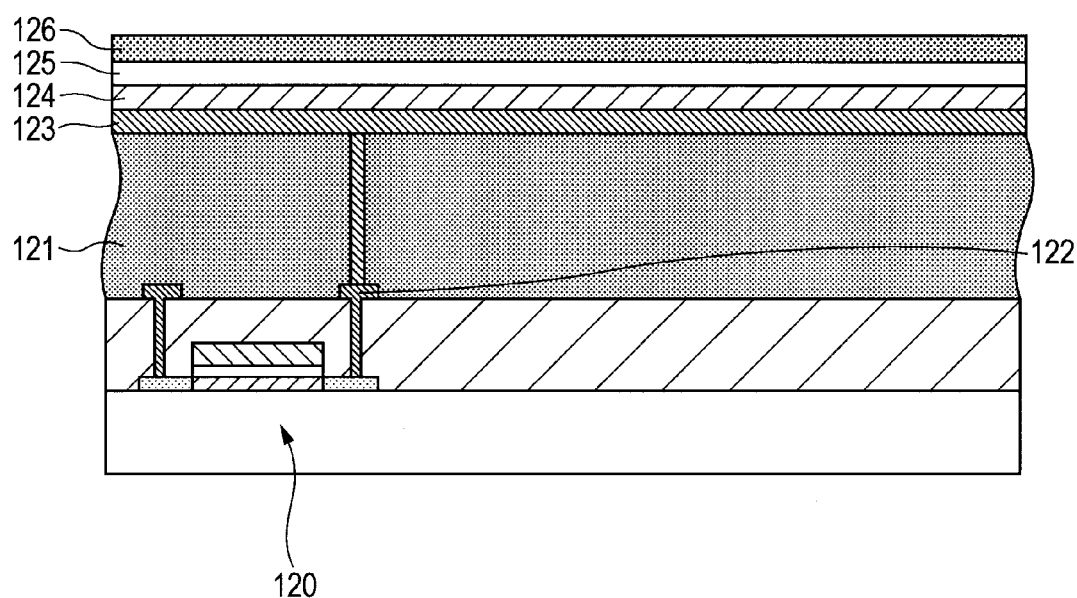
FIG. 9 is a cross-sectional view of an example of a display apparatus according to the present invention.

FIG. 9 illustrates a display apparatus according to this example, which is a display apparatus including an oxide semiconductor TFT having a top gate coplanar structure and a display device. The oxide semiconductor TFT was manufactured in the same manner as in Example 1. Note that, the oxide semiconductor TFT illustrated in any one of FIGS. 1 to 3 and FIG. 8 may be used.

First, on an oxide semiconductor TFT 120 of the present invention, a silicon nitride film was formed as an insulating layer 121 by a plasma-enhanced CVD method. After that, a contact hole was formed in the insulating layer 121 by a photolithography method and an etching method. Next, on the insulating layer 121, an ITO film was formed as an electrode layer 123 by a sputtering method, which is connected to a source wiring layer 122 through intermediation of the insulating layer 121. After that, on the electrode layer 123, a hole transport layer 124 and a light-emitting layer 125 were formed by a deposition method. α-NPD and $Al_{q3}$ are used for the hole transport layer 124 and the light-emitting layer 125, respectively. Finally, an MgAg film was formed on the light-emitting layer 125 as the electrode layer 126 by a deposition method.

Through the above-mentioned steps, the display apparatus of this example was completed, which includes the oxide semiconductor TFT of the present invention and an organic electro-luminescence element as the display device, and in which the source electrode layer or the drain electrode layer of the TFT is electrically connected to the display device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-174234, filed Aug. 3, 2010, which is hereby incorporated by reference herein in its entirety.

What is claimed is:

1. A top gate thin film transistor, comprising on a substrate:
   a source electrode layer;
   a drain electrode layer;
   an oxide semiconductor layer;
   a gate insulating layer;
   a gate electrode layer including an amorphous oxide semiconductor containing at least one kind of element selected from among In, Ga, Zn, and Sn; and
   a protective layer containing hydrogen, wherein:
   the gate insulating layer is formed on a channel region of the oxide semiconductor layer;
   the gate electrode layer is formed on the gate insulating layer;
   the protective layer is formed on the gate electrode layer and a region except the channel region of the oxide semiconductor layer; and
   a width of the gate insulating layer is smaller than a width of the oxide semiconductor layer in a channel length direction.

2. The top gate thin film transistor according to claim 1, wherein the source electrode layer, the drain electrode layer, and the channel region are formed in the same oxide semiconductor layer.

3. The top gate thin film transistor according to claim 1, wherein the oxide semiconductor layer is formed of an amorphous oxide semiconductor.

4. A display apparatus, comprising:
   the top gate thin film transistor according to claim 1; and
   a display device,
   wherein the display device is electrically connected to one of a source electrode layer and a drain electrode layer of the top gate thin film transistor.

5. The top gate thin film transistor according to claim 2, wherein the source electrode layer, the drain electrode layer, and the channel region are formed in a self alignment manner.

* * * * *